United States Patent
Araki et al.

(10) Patent No.: US 10,959,327 B2
(45) Date of Patent: Mar. 23, 2021

(54) MULTILAYER WIRING SUBSTRATE

(71) Applicant: Murata Manufacturing Co., Ltd., Nagaokakyo (JP)

(72) Inventors: Shinichi Araki, Nagaokakyo (JP); Hideyuki Taguchi, Nagaokakyo (JP); Hayato Noma, Nagaokakyo (JP); Ryosuke Takada, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/412,489

(22) Filed: May 15, 2019

(65) Prior Publication Data

US 2019/0269010 A1    Aug. 29, 2019

Related U.S. Application Data

(63) Continuation of application No. PCT/JP2017/038178, filed on Oct. 23, 2017.

(30) Foreign Application Priority Data

Dec. 2, 2016  (JP) .............................. JP2016-235365
May 31, 2017  (JP) .............................. JP2017-108417

(51) Int. Cl.
*H05K 1/02* (2006.01)
*H05K 1/03* (2006.01)
(Continued)

(52) U.S. Cl.
CPC ......... *H05K 1/0298* (2013.01); *H05K 1/0373* (2013.01); *H05K 3/28* (2013.01);
(Continued)

(58) Field of Classification Search
CPC ...... H05K 1/0298; H05K 1/0373; H05K 3/28; H05K 3/4644; H05K 2201/0129;
(Continued)

(56) References Cited

U.S. PATENT DOCUMENTS 5,478,972 A * 12/1995 Mizutani .............. H05K 3/4038
                                                     174/250
5,519,177 A *  5/1996 Wang ....................... C08J 3/005
                                                     174/259
(Continued)

FOREIGN PATENT DOCUMENTS

JP        63-24695 A     2/1988
JP     2000-312064 A    11/2000
(Continued)

OTHER PUBLICATIONS

Official Communication issued in International Patent Application No. PCT/JP2017/038178, dated Jan. 23, 2018.
(Continued)

*Primary Examiner* — Steven T Sawyer
(74) *Attorney, Agent, or Firm* — Keating & Bennett, LLP

(57) ABSTRACT

A plate-shaped multilayer wiring substrate includes at least two resin layers stacked on top of each other and each including an insulating base and a conductive pattern provided on the insulating base, and a front surface layer joined onto the resin layers stacked. The front surface layer has a higher elastic modulus than an elastic modulus of the insulating bases. A joint interface between the resin layers and the front surface layer includes projections and depressions. Also, a method for manufacturing the plate-shaped multilayer wiring substrate includes a step of stacking, on top of resin layers, a front surface layer having a higher elastic modulus than an elastic modulus of the resin layers, and a step of performing pressing under pressure from above the front surface layer by using a flat surface in a heated state to join the resin layers and the front surface layer.

21 Claims, 11 Drawing Sheets

(51) Int. Cl.
*H05K 3/28* (2006.01)
*H05K 3/46* (2006.01)

(52) U.S. Cl.
CPC ............ *H05K 3/46* (2013.01); *H05K 3/4644* (2013.01); *H05K 2201/0129* (2013.01); *H05K 2201/0141* (2013.01); *H05K 2201/0195* (2013.01); *H05K 2201/0332* (2013.01)

(58) Field of Classification Search
CPC ... H05K 2201/0141; H05K 2201/0195; H05K 2201/0332
See application file for complete search history.

(56) References Cited

U.S. PATENT DOCUMENTS

| | | | |
|---|---|---|---|
| 6,217,987 B1* | 4/2001 | Ono | G03F 7/032 174/250 |
| 6,365,843 B1* | 4/2002 | Shirai | H05K 1/113 174/262 |
| 2001/0005545 A1* | 6/2001 | Andou | H05K 3/20 428/209 |
| 2004/0170006 A9* | 9/2004 | Sylvester | H05K 1/162 361/794 |
| 2005/0281995 A1* | 12/2005 | Murai | B32B 7/12 428/209 |
| 2006/0278963 A1 | 12/2006 | Harada et al. | |
| 2009/0056995 A1* | 3/2009 | Maeda | B32B 15/08 174/259 |
| 2009/0106975 A1* | 4/2009 | Ookawa | H05K 3/22 29/846 |
| 2011/0259632 A1* | 10/2011 | Oosawa | H05K 1/0245 174/266 |
| 2012/0211269 A1* | 8/2012 | Saitou | H05K 3/38 174/260 |
| 2012/0298409 A1* | 11/2012 | Kwon | H05K 3/4007 174/262 |
| 2013/0048345 A1* | 2/2013 | Masuda | H05K 3/4626 174/251 |
| 2013/0256002 A1* | 10/2013 | Ozeki | C08L 77/00 174/251 |
| 2014/0060898 A1* | 3/2014 | Findley | H05K 3/284 174/255 |
| 2014/0124250 A1* | 5/2014 | Iwasaki | H05K 1/115 174/255 |
| 2014/0264737 A1 | 9/2014 | Gouchi | |
| 2014/0326487 A1* | 11/2014 | Ozeki | H05K 3/022 174/254 |
| 2015/0195907 A1* | 7/2015 | Chung | H01L 24/19 174/258 |
| 2015/0342039 A1* | 11/2015 | Wu | H05K 1/036 174/251 |
| 2017/0231100 A1* | 8/2017 | Sun | H05K 3/28 |
| 2018/0043653 A1* | 2/2018 | Sutou | B32B 7/12 |

FOREIGN PATENT DOCUMENTS

| | | |
|---|---|---|
| JP | 2001-313468 A | 11/2001 |
| JP | 2006-344828 A | 12/2006 |
| JP | 2007-288179 A | 11/2007 |
| JP | 2013-065810 A | 4/2013 |
| JP | 2013-197136 A | 9/2013 |
| JP | 5574071 B1 | 8/2014 |
| JP | 2014-232853 A | 12/2014 |
| JP | 2015-070101 A | 4/2015 |
| WO | 2013/077397 A1 | 5/2013 |
| WO | 2014/178153 A1 | 11/2014 |

OTHER PUBLICATIONS

Official Communication issued in Japanese Patent Application No. 2019-044729, dated Jan. 7, 2020.

* cited by examiner

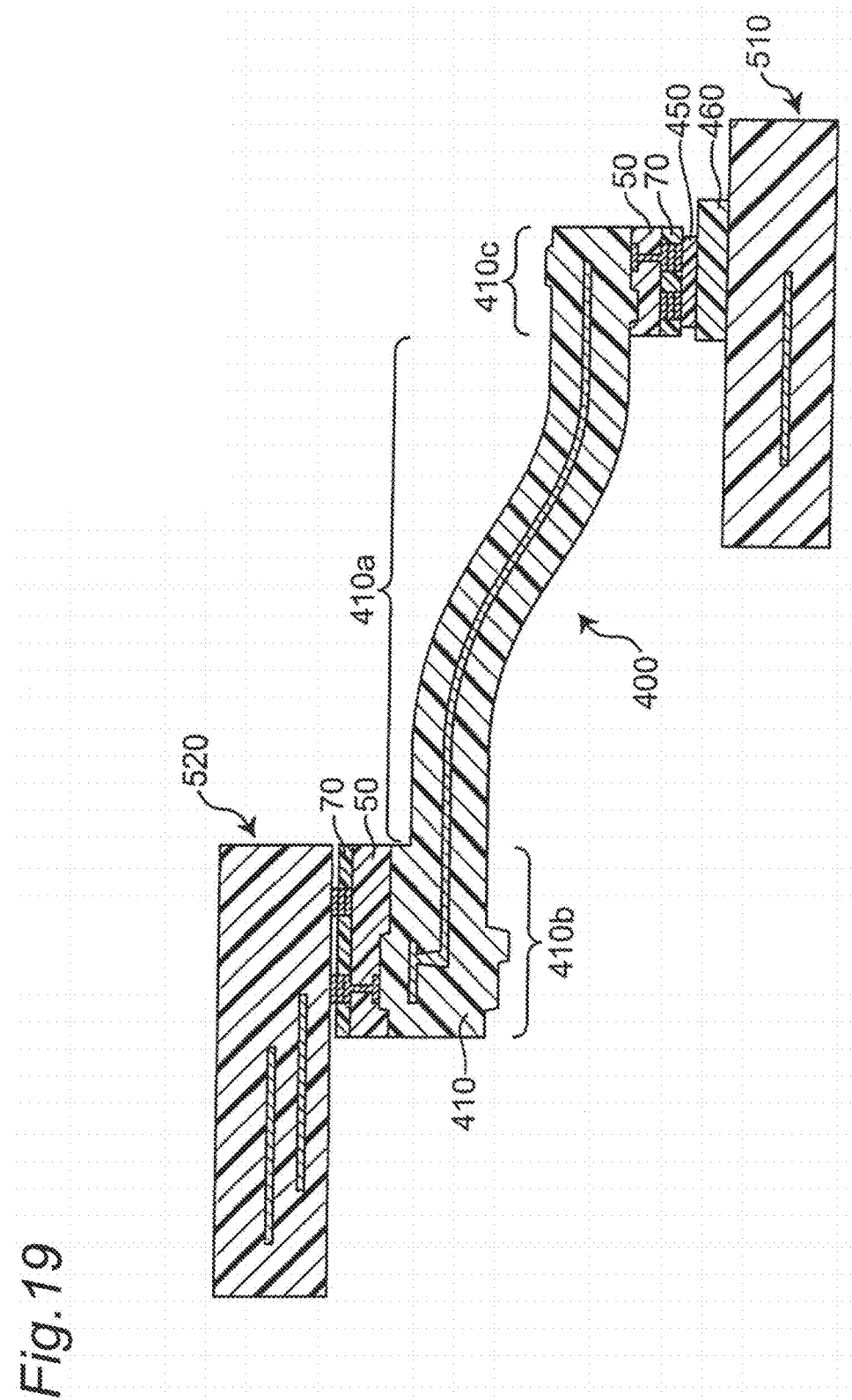

MULTILAYER WIRING SUBSTRATE

CROSS REFERENCE TO RELATED APPLICATIONS

This application claims the benefit of priority to Japanese Patent Application No. 2016-235365 filed on Dec. 2, 2016 and Japanese Patent Application No. 2017-108417 filed on May 31, 2017, and is a Continuation Application of PCT Application No. PCT/JP2017/038178 filed on Oct. 23, 2017. The entire contents of each application are hereby incorporated herein by reference.

BACKGROUND OF THE INVENTION

1. Field of the Invention

The present invention relates to a plate-shaped multilayer wiring substrate, and in particular, to a multilayer wiring substrate in which a front surface layer made of a resin having a high elastic modulus is provided on resin layers.

2. Description of the Related Art

A conventional multilayer wiring substrate is manufactured by preparing a plurality of resin sheets, which are made of substantially the same material and which include conductive patterns and interlayer connection conductors, and by applying heat and pressure to the resin sheets stacked on top of each other, to thereby join the resin sheets together (see JP 5574071 B2, for example).

However, when the material of the resin sheets is selected with priority given to electrical properties, mechanical properties of the resin sheets are lowered in some cases. In addition, resin sheets having a low elastic modulus are easily deformed, causing a problem in that it is difficult to mount a surface mount component. Furthermore, a multilayer wiring substrate in which a front surface sheet having a different elastic modulus is stacked on resin layers, has another problem in that mechanical strength is low due to difference in thermal expansion coefficient, for example.

SUMMARY OF THE INVENTION

Preferred embodiments of the present invention provide multilayer wiring substrates which each include flat surfaces and have an excellent mechanical strength.

A multilayer wiring substrate according to a preferred embodiment of the present invention includes at least two resin layers stacked on top of each other, each of the at least two resin layers including an insulating base and a conductive pattern provided on the insulating base; and a front surface layer joined onto the resin layers stacked. The front surface layer has a higher elastic modulus than an elastic modulus of the insulating bases. The multilayer wiring substrate is a plate-shaped multilayer wiring substrate. A joint interface between the resin layers and the front surface layer has projections and depressions.

A method for manufacturing a plate-shaped multilayer wiring substrate according to a preferred embodiment of the present invention includes a step of preparing at least two resin layers, each of the at least two resin layers including an insulating base and a conductive pattern provided on the insulating base; a step of stacking the resin layers on top of each other and performing a hot press to form projections and depressions and join the resin layers to each other; a step of stacking, on top of the resin layers, a front surface layer having a higher elastic modulus than an elastic modulus of the resin layers; and a step of performing pressing under pressure from above the front surface layer using a flat surface in a heated state to join the resin layers and the front surface layer. A joint interface between the resin layers and the front surface layer includes projections and depressions.

As described above, in preferred embodiments of the present invention, since a surface of resin layers includes projections and depressions, it is possible to achieve a highly reliable multilayer wiring substrate including flat surfaces, in which a difference in thermal expansion coefficient or an impact is less likely to cause a front surface layer to peel off from the resin layers.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 19 is a cross-sectional view illustrating a case in which the multilayer wiring substrate according to the fourth preferred embodiment of the present invention in a bent state is connected to mount substrates.

DETAILED DESCRIPTION OF THE PREFERRED EMBODIMENTS

Figure 1:
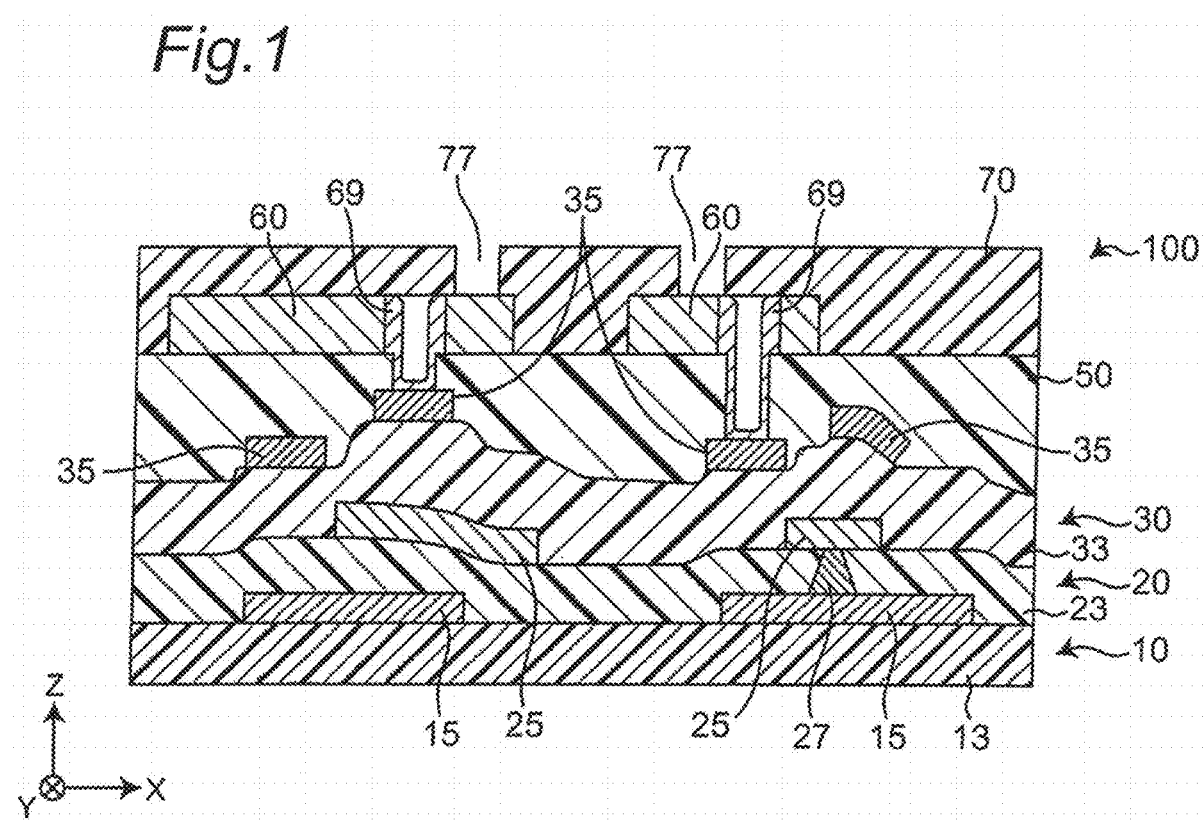
FIG. 1 is a cross-sectional view of a multilayer wiring substrate according to a first preferred embodiment of the present invention.

Multilayer wiring substrates according to preferred embodiments of the present invention each include at least two resin layers stacked on top of each other, each of the at least two resin layers including an insulating base and a conductive pattern provided on the insulating base; and a front surface layer joined onto the resin layers stacked. The front surface layer preferably has a higher elastic modulus than an elastic modulus of the insulating bases. The multilayer wiring substrate is preferably a plate-shaped multilayer wiring substrate. A joint interface between the resin layers and the front surface layer includes projections and depressions. The multilayer wiring substrate described above, in which a surface of the resin layers includes projections and depressions, is a highly reliable multilayer wiring substrate having flat surfaces, in which a difference in thermal expansion coefficient or an impact is less likely to cause the front surface layer to peel off.

According to a preferred embodiment of the present invention, the front surface layer preferably contains a glass filler, for example. Since the front surface layer contains a glass filler, the elastic modulus of the front surface layer is improved. Also, a difference in thermomechanical properties arising due to density difference in the glass filler in the front surface layer is prevented, such that changes in properties due to deformation are less likely to occur.

According to a preferred embodiment of the present invention, a particle diameter of the glass filler is preferably smaller than a height difference between the projections and the depressions on the joint interface. Since the particle diameter is smaller than the height difference, narrow regions are able to be uniformly filled.

According to a preferred embodiment of the present invention, a portion of the glass filler is preferably disposed in the depressions on the joint interface. This enables the front surface layer to have uniform physical properties.

According to a preferred embodiment of the present invention, the glass filler is preferably entirely disposed in the depressions on the joint interface. This enables the front surface layer to have uniform physical properties.

According to a preferred embodiment of the present invention, a particle diameter of the glass filler is preferably smaller than a film thickness of the conductive patterns. Since the particle diameter is smaller than the film thickness of the conductive patterns, narrow regions are able to be uniformly filled.

According to a preferred embodiment of the present invention, a particle diameter of the glass filler is preferably, for example, equal to or less than about one-third of the smaller of height difference between the projections and the depressions on the joint interface and a film thickness of the conductive patterns. Since the particle diameter is equal to or less than about one-third of the smaller of height difference between the projections and the depressions on the joint interface and the film thickness of the conductive patterns, narrow regions are able to be uniformly filled.

According to a preferred embodiment of the present invention, the glass filler is preferably also present in a thinnest portion of the front surface layer. The uniform filling with the glass filler allows the front surface layer to have uniform properties.

According to a preferred embodiment of the present invention, the glass filler preferably has a bimodal particle diameter distribution. This enables filling with the glass filler at very high density, allowing the front surface layer to have uniform properties as well as improved rigidity. The particle diameter of the glass filler is measured by performing cross-section cutting of portions of the glass filler, projecting each exposed cross section with a scanning electron microscope (SEM), and measuring the size of the glass filler in the field of view. In the measurement method, the average of a maximum length and a minimum length of the glass filler cross sections is considered as the particle diameter of the glass filler. The observation with the SEM is made at a magnification of, for example, about 5000 times (in FIGS. 5 and 7), and the SEM is VE-7800 manufactured by KEYENCE CORPORATION.

According to a preferred embodiment of the present invention, the front surface layer is preferably made of a thermosetting resin, for example. Since a thermosetting resin is used, the front surface layer is finally cured in a hot press step, so as to easily form the joint interface with projections and depressions.

According to a preferred embodiment of the present invention, the thermosetting resin is preferably made of an epoxy resin, for example. The use of a commonly used epoxy resin enables the manufacturing cost to be reduced.

According to a preferred embodiment of the present invention, the glass filler is preferably glass fiber, for example. Since the front surface layer contains glass fiber, the elastic modulus of the front surface layer is improved.

According to a preferred embodiment of the present invention, the resin layers are preferably made of a thermoplastic resin, for example. Making the resin layers from a thermoplastic resin enables the resin layers to be directly joined to each other in a step of pressing under pressure.

According to a preferred embodiment of the present invention, the resin layers preferably further include an interlayer connection conductor passing through the insulating bases and containing a resin component; and the front surface layer further includes an interlayer connection conductor passing through the front surface layer and containing no resin component. Providing an interlayer connection conductor in the front surface layer enables variations in resistance values to be reduced even if the length of the interlayer connection conductor varies according to the thickness of the front surface layer.

According to a preferred embodiment of the present invention, a surface conductor having a film thickness larger than a film thickness of the conductive patterns included in the resin layers is preferably provided on a surface of the front surface layer opposite to the joint interface. Increasing the film thickness of the surface conductor on the front surface layer makes the surface conductor and the front surface layer less likely to deform, such that the front surface layer is less likely to peel off.

According to a preferred embodiment of the present invention, a back surface layer having a higher elastic modulus than an elastic modulus of the insulating bases is preferably joined onto a surface of the resin layers opposite to the joint interface. Providing the back surface layer further increases the elastic modulus of the multilayer wiring substrate.

According to a preferred embodiment of the present invention, a joint interface between the back surface layer and the resin layers preferably includes projections and depressions. Since the joint interface between the back surface layer and the resin layers includes projections and depressions, a difference in thermal expansion coefficient or an impact is less likely to cause the back surface layer to peel off, thus improving the reliability.

According to a preferred embodiment of the present invention, the front surface layer is preferably made of a material identical to a material of the back surface layer. This allows the front surface layer and the back surface layer to be simultaneously produced under the same manufacturing conditions.

According to a preferred embodiment of the present invention, the resin layers preferably include a first portion joined to the front surface layer or to the back surface layer, and a second portion that is not joined to either of the front surface layer or the back surface layer. A mount substrate, for example, is able to be easily mounted to the regions at which the front surface layer and the back surface layer are provided, by deforming the portion of the resin layers that is not covered with the front surface layer and the back surface layer.

According to a preferred embodiment of the present invention, the second portion is preferably bent. Even when the resin layers are bent, a mount substrate, for example, is able to be mounted to the regions of the resin layers at which the front surface layer and the back surface layer are provided.

According to a preferred embodiment of the present invention, the multilayer wiring substrate preferably further includes a mount component electrically connected to the conductive patterns. This makes it possible to connect three-dimensional wiring to the mount component.

According to a preferred embodiment of the present invention, a method for manufacturing a plate-shaped multilayer wiring substrate preferably includes a step of preparing at least two resin layers each including an insulating base and a conductive pattern provided on the insulating base; a step of stacking the resin layers on top of each other and performing a hot press to join the resin layers to each other and to form projections and depressions on a surface of the resin layers; a step of stacking, on top of the resin layers, a front surface layer having a higher elastic modulus than an elastic modulus of the resin layers; and a step of performing pressing under pressure from above the front surface layer using a flat surface in a heated state to join the resin layers and the front surface layer. A joint interface between the resin layers and the front surface layer includes projections and depressions. With this manufacturing method, a plate-shaped multilayer wiring substrate having flat surfaces on both sides is able to be obtained. In addition, since the joint interface between the resin layers and the front surface layer includes projections and depressions, the joint strength of the joint interface is able to be improved.

According to a preferred embodiment of the present invention, the pressing step preferably includes a step of maintaining a temperature of the front surface layer without application of pressure at a temperature between a melting start temperature and a minimum viscosity temperature on a temperature viscosity curve, and then applying pressure at a temperature equal to or higher than the minimum viscosity temperature. In this step, pressure is applied after the front surface layer is softened and deformed into a shape that follows the projections and the depressions on the surface of the resin sheets, so that the joint strength of the joint interface is able to be improved.

According to aspect preferred embodiment of the present invention, the method for manufacturing a plate-shaped multilayer wiring substrate preferably further includes a step of fixing a mount component over the front surface layer. This makes it possible to connect three-dimensional wiring to the mount component.

Preferred embodiments of the present invention will be described below with reference to the drawings. In the drawings, for ease of understanding, some elements are enlarged and are not drawn to scale.

First Preferred Embodiment

FIG. 1 is a cross-sectional view of a plate-shaped multilayer wiring substrate according to a first preferred embodiment of the present invention, which is denoted as a whole by the reference numeral 100. The multilayer wiring substrate 100 preferably includes resin sheets 10, 20, and 30, which define resin layers. The resin sheet 10 is preferably defined by an insulating base 13 and a conductive pattern 15 provided on a front surface of the insulating base 13. The insulating base 13 is preferably made of a thermoplastic resin, such as a liquid crystal polymer (LCP), for example. The conductive pattern 15 is preferably made of a conductive metal, such as copper, for example (the same holds true for insulating bases 23 and 33 and conductive patterns 25 and 35). The resin sheets may be resin sheets formed by, for example, printing, such as resin sheets used in a build-up substrate. Also, the plate shape need not necessarily have a smooth front surface and a smooth back surface, but may have a flat or substantially flat front surface and a flat or substantially flat back surface.

The resin sheet 20 includes the insulating base 23, the conductive pattern 25 provided on a front surface of the insulating base 23, and an interlayer connection conductor 27 defined by a via conductor, which passes through the insulating base 23 from the front surface to a back surface. The interlayer connection conductor 27 electrically connects the conductive pattern 15 and the conductive pattern 25. In the following description, the positive side of a Z-axis in FIG. 1 will be referred to as an "upper side" or a "front side" and the negative side of the Z-axis will be referred to as a "lower side" or a "back side".

The resin sheet 30 includes the insulating base 33 and the conductive pattern 35 provided on a front surface of the insulating base 33.

The resin sheets 10, 20, and 30 are preferably made of a thermoplastic resin, for example, and are directly joined together by thermocompression bonding without any adhesive of a different material sandwiched between the resin sheets 10, 20, and 30. Thus, the bond strength between the resin sheets is improved as compared with a case in which an adhesive is sandwiched. The front surface of the resin sheet 30 includes projections and depressions under the influence of the conductive pattern 15, for example.

The front surface of the resin sheet 30 is preferably covered with a front surface sheet 50, which defines a front surface layer. The front surface sheet 50 is preferably made of a thermosetting resin such as, for example, an epoxy resin, and may be made, for example, of an epoxy resin (glass epoxy) containing a filler, such as glass fiber or spherical glass, or an epoxy resin containing other filler, such as ceramic. A front surface of the front surface sheet 50 is flat or substantially flat. On the front surface of the front surface sheet 50, a surface conductor 60 made of, for example, a copper foil is provided, and interlayer connection conductors 69 defined by a plated-through hole conductor are also provided to pass through the surface conductor 60 for connection with the conductive pattern 35 beneath the interlayer connection conductors 69. The interlayer connection conductors 69 may have a structure in which wall surfaces of the through hole are coated with the conductor or a structure in which the entire through hole is filled with the conductor. The conductor used for the interlayer connection conductors 69 is preferably made of a plating material that contains no resin component, for example, copper plating.

Figure 2:
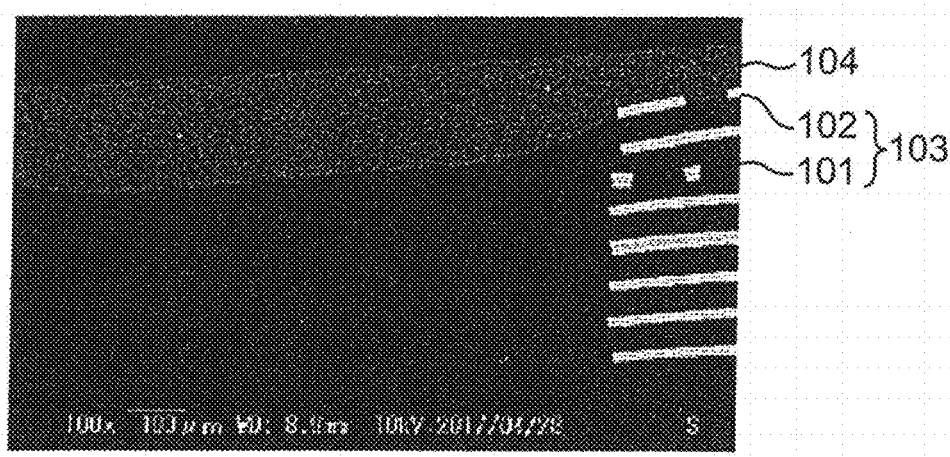
FIG. 2 is a photograph of a cross-section of a multilayer wiring substrate in which a front surface sheet is made from an epoxy resin containing a glass filler.
Figure 3:
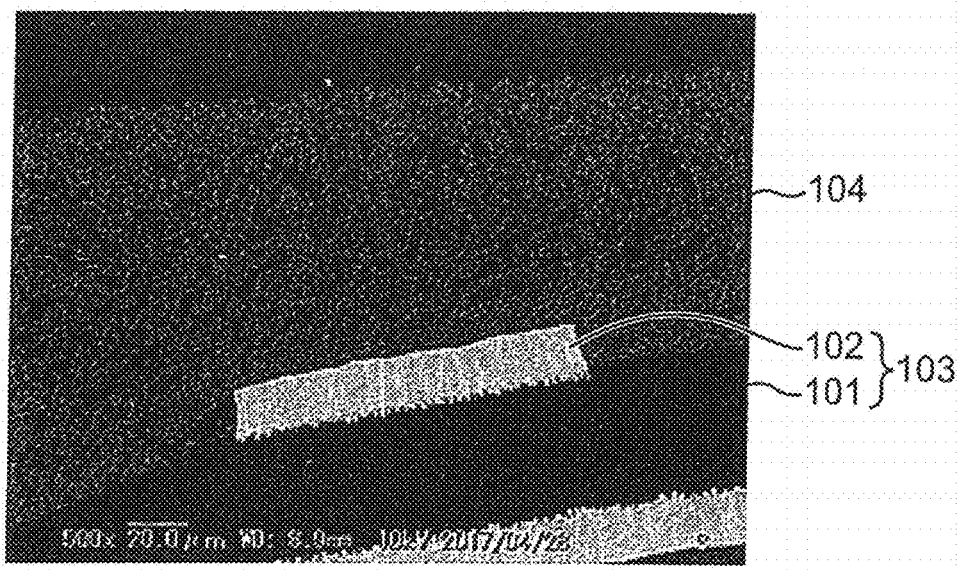
FIG. 3 is a photograph, on an enlarged scale, of the cross-section of the multilayer wiring substrate of FIG. 2.

FIG. 2 is a photograph of a cross-section of a multilayer wiring substrate in which a front surface sheet is made of an epoxy resin containing a glass filler. FIG. 3 is a photograph, on an enlarged scale, of the cross-section of FIG. 2. In FIGS. 2 and 3, a front surface sheet 104 is provided on a resin sheet 103 including an insulating base 101 and a conductive pattern 102.

In the front surface sheet 104 of FIG. 3, bright areas are a spherical glass filler, and dark areas are an epoxy resin. The spherical glass filler content in the front surface sheet 104 preferably ranges from about 20% by volume to about 70% by volume, for example. The spherical glass filler includes a shape, such as an ellipsoid, for example, in addition to a perfectly spherical glass filler.

Figure 4:
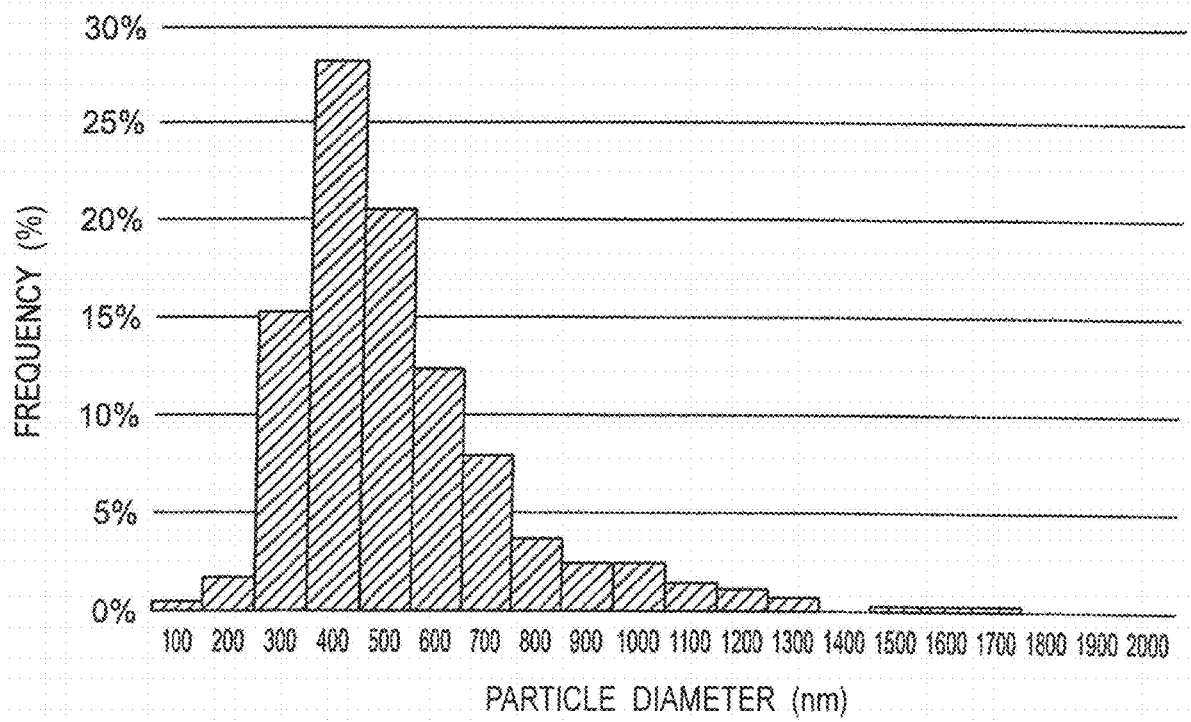
FIG. 4 shows a particle diameter distribution (a unimodal distribution) of the glass filler.
Figure 5:
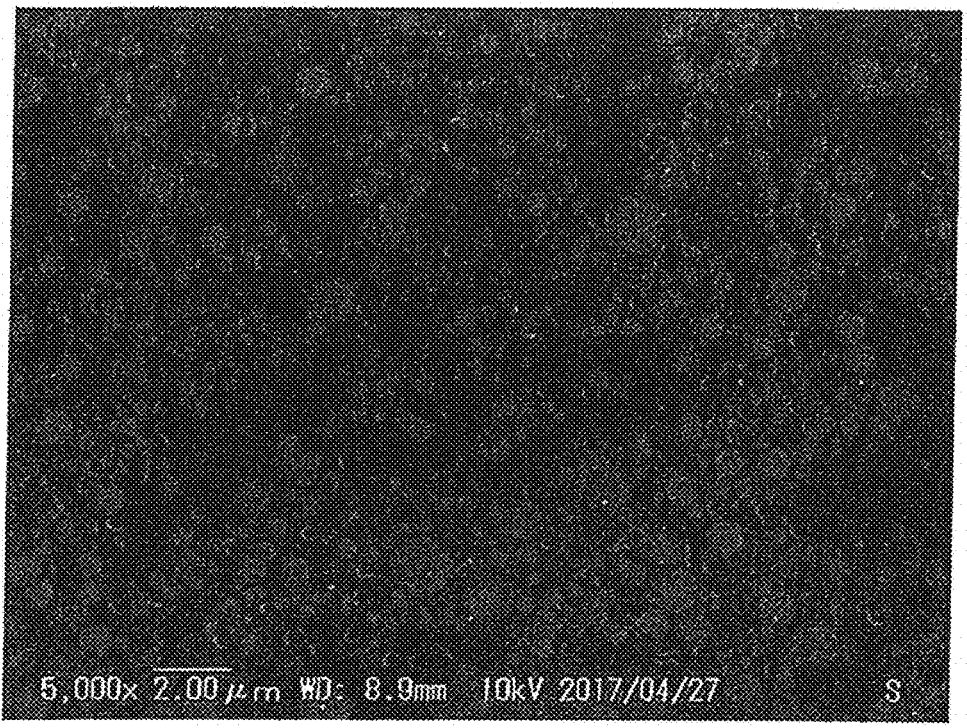
FIG. 5 is a photograph of a cross-section of the front surface sheet containing the glass filler having the particle diameter distribution of FIG. 4.

FIG. 4 shows a particle diameter distribution of the glass filler. In FIG. 4, the horizontal axis represents the particle diameter of the spherical glass filler, and the vertical axis represents frequency. FIG. 5 is a photograph of a cross-section of the front surface sheet containing the glass filler having such a particle diameter distribution.

As shown in FIG. 4, the particle diameter distribution of the spherical glass filler is a unimodal distribution with an average particle diameter of about 400 nm. The average particle diameter, about 400 nm, of the spherical glass filler is very small as compared, for example, to the film thickness, about 6 μm, of the conductive pattern 102 and the film thickness, about 20 μm, of the front surface sheet 104. In the front surface sheet 104 containing the spherical glass filler having such small particle diameters, the spherical glass filler has high fluidity. Thus, when the front surface sheet 104 is bonded onto the resin sheet 103, the spherical glass filler follows projections and depressions on the joint interface, and this is able to move. This results in the formation of the front surface sheet 104 having a thin film thickness and containing the uniformly distributed spherical glass filler.

The particle diameter of the spherical glass filler is preferably smaller than height difference between the projections and the depressions on the joint interface, and more preferably smaller than the film thickness of the conductive patterns. More preferably, the particle diameter of the spherical glass filler is equal to or less than about one-third of the smaller of the height difference between the projections and the depressions on the joint interface and the film thickness of the conductive patterns. When the particle diameter of the spherical glass filler is in such a size range, the projections and the depressions on the joint interface and regions around the conductive patterns are able to be easily filled with the spherical glass filler. Further, thin portions of the front surface sheet, such as portions above the protrusions on the joint interface, are able to be filled. As a result, the spherical glass filler is uniformly distributed throughout the front surface sheet, allowing the front surface sheet to have uniform properties.

Figure 6:
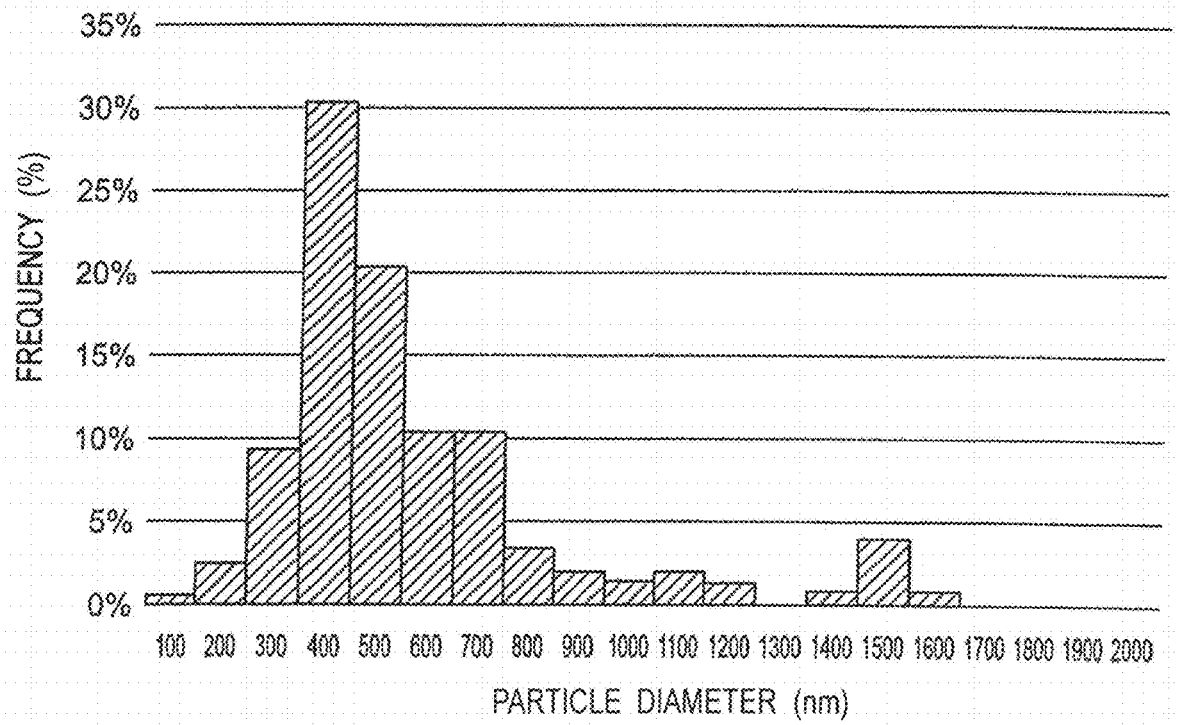
FIG. 6 shows a particle diameter distribution (a bimodal distribution) of a glass filler.
Figure 7:
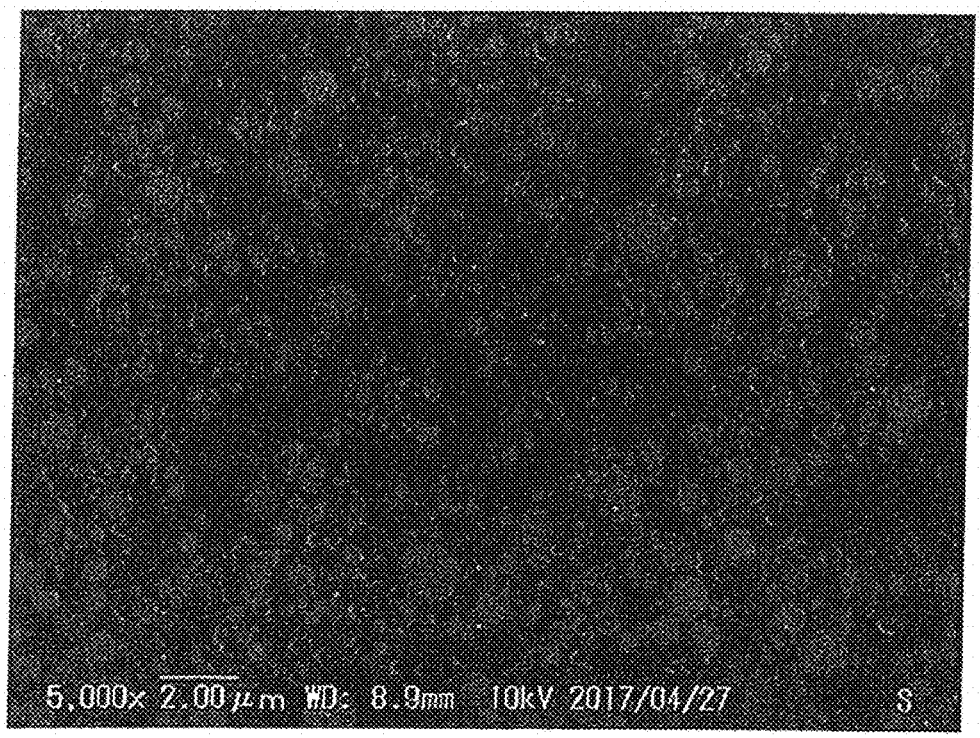
FIG. 7 is a photograph of a cross-section of a front surface sheet containing a glass filler having the particle diameter distribution of FIG. 6.

The particle diameter distribution of the spherical glass filler may be a bimodal distribution as shown in FIG. 6. In FIG. 6, the horizontal axis represents the particle diameter of a spherical glass filler, and the vertical axis represents frequency. FIG. 7 is a photograph of a cross-section of a front surface sheet containing a glass filler having such a particle diameter distribution. As can be seen from FIG. 6, the particle diameter distribution of the spherical glass filler is a bimodal distribution in which the average particle diameter has peaks at about 400 nm and about 1500 nm.

Since the spherical glass filler has a bimodal distribution and the spherical glass filler contains large diameter particles and small diameter particles, the filling with the spherical glass filler with very high density is able to be achieved. Also, the portion of the spherical glass filler containing the large diameter particles improves rigidity, while the portion of the spherical glass filler containing the small diameter particles is uniformly distributed, has a large specific surface area, and is thus easily fixed by the epoxy resin in the front surface sheet. The use of the spherical glass filler having the bimodal particle diameter distribution allows these properties to be combined to achieve the front surface sheet having high rigidity, uniform physical properties, and the strongly bonded joint interface.

The front surface of the front surface sheet 50 is preferably covered with a protective film 70 made, for example, of a solder resist. The protective film 70 is provided with openings 77 as needed, and the surface conductor 60 is exposed at bottoms of the openings 77. The openings 77 are used to electrically connect a surface mount component (see FIG. 8), which is mounted over the protective film 70, and the surface conductor 60.

Figure 8:
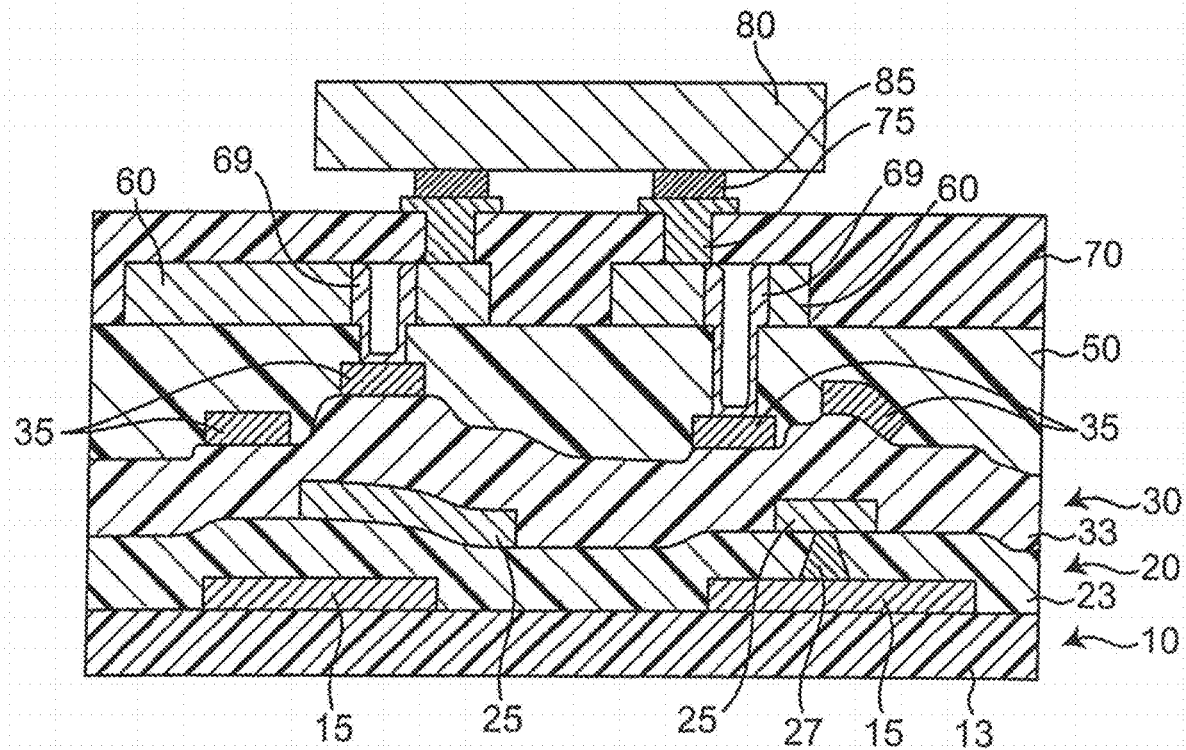
FIG. 8 is a cross-sectional view illustrating a case in which a surface mount component is mounted over the multilayer wiring substrate according to the first preferred embodiment of the present invention.

FIG. 8 is a cross-sectional view illustrating a case in which a surface mount component 80 is mounted over the multilayer wiring substrate 100 according to the first preferred embodiment of the present invention. Electrodes 85 of the surface mount component 80 are preferably electrically connected to the surface conductor 60 by solder 75, such as lead-free solder, for example.

In this manner, the upper surface of the front surface sheet 50 is flat or substantially flat in the multilayer wiring substrate 100 according to the first preferred embodiment of the present invention. Therefore, the surfaces of the surface conductor 60 and the protective film 70 provided on the front surface sheet 50 are also flat or substantially flat, so as to improve the reliability of the connection with the surface mount component 80 mounted over the multilayer wiring substrate 100.

Further, since the resin sheets 10, 20, and 30 are covered with the front surface sheet 50 having a high elastic modulus, deformation due to an external impact is less likely to occur, thus improving the connection reliability of the surface mount component 80.

Next, a non-limiting example of a method for manufacturing the plate-shaped multilayer wiring substrate 100 according to the first preferred embodiment of the present invention will be described with reference to FIGS. 9 to 13. The method for manufacturing the multilayer wiring substrate 100 preferably includes the following steps 1 to 5. In FIGS. 9 to 13, reference numerals that are the same as those in FIGS. 1 and 8 denote the same or corresponding portions.

Figure 9:
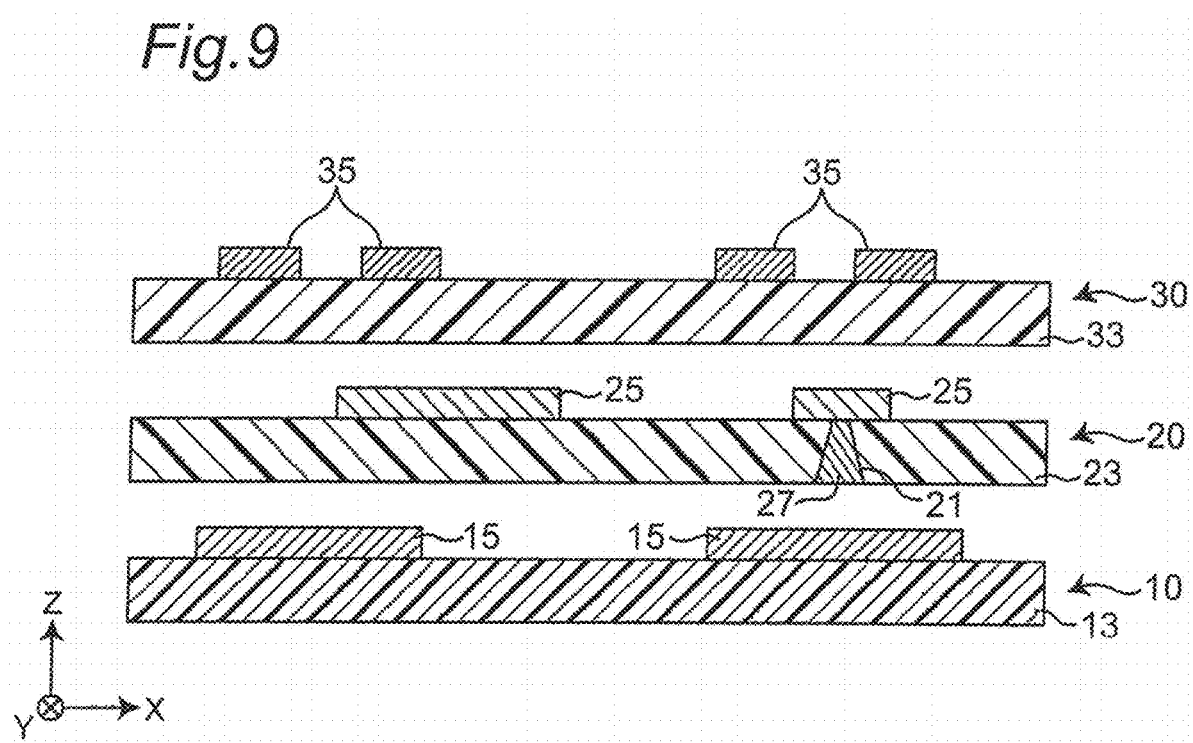
FIG. 9 is a cross-sectional view illustrating a manufacturing step of the multilayer wiring substrate according to the first preferred embodiment of the present invention.

Step 1: As shown in FIG. 9, the resin sheets 10, 20, and 30, which form resin layers, are prepared. In the resin sheets 10, 20, and 30, the conductive patterns 15, 25, and 35 are respectively formed on the front surfaces of the insulating bases 13, 23, and 33. The conductive patterns 15, 25, and 35 are preferably formed by applying a conductive material layer on the insulating bases 13, 23, and 33 and patterning the conductive material layers by photolithography and etching.

The insulating base 23 of the resin sheet 20 is provided with an opening 21, which is filled with conductive paste. In the cross-sectional view shown in FIG. 3, the opening 21 is preferably formed only in the resin sheet 20, but the opening 21 may be formed in the other resin sheets 10 and 20 as needed.

Figure 10:
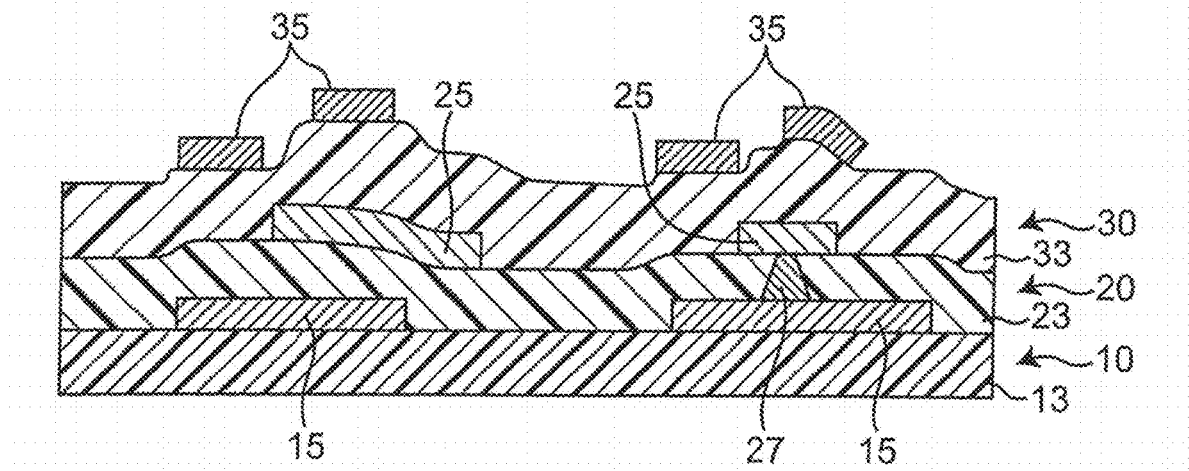
FIG. 10 is a cross-sectional view illustrating a manufacturing step of the multilayer wiring substrate according to the first preferred embodiment of the present invention.

Step 2: As shown in FIG. 10, the resin sheet 10 is preferably placed on a smooth base (not shown) made of a hard material, and the resin sheets 20 and 30 are sequentially stacked on the resin sheet 10. The resin sheets 20 and 30 in this state are heated to a temperature ranging, for example, from about 250° C. to about 300° C., inclusive, and isostatic pressing or quasi-isostatic pressing using, for example, hydrostatic pressure is performed. The pressing may be performed with a cushion layer, for example, a silicone resin, placed on the resin sheet 30. The resin sheets 10, 20, and 30 are made of a thermoplastic resin, and thus are joined to one another in response to the pressure applied to the resin sheets 10, 20, and 30 in a softened state. In this step, the conductive paste put into the opening 21 is also heated and cured to form the interlayer connection conductor 27. The resin component remains in the interlayer connection conductor 27.

In step 2, the resin sheets 10, 20, and 30 are softened, but the conductive patterns 15, 25, and 35 made of metal, such as copper foil, for example, and the interlayer connection conductor 27 are not softened. Therefore, after step 2, the back surface of the resin sheet 10 in contact with the smooth base made of a hard material is flat, but the front surface side, to which pressure is applied, deforms, resulting in the resin sheet 30 including a front surface with projections and depressions, as shown in FIG. 10.

Step 3: The front surface sheet 50 and the surface conductor 60 are placed on the front surface of the resin sheet 30 with the resin sheets 10, 20, and 30 placed on the smooth base (not shown) made of a hard material. As the front surface sheet 50, a thermosetting resin, for example, an epoxy resin, or an epoxy resin (glass epoxy) containing glass fiber or a spherical glass filler, is preferably used. As the front surface sheet 50 containing a spherical glass filler, for example, a bisphenol A diglycidyl ether resin to which about 25% by volume of the glass filler has been added, is used.

Figure 14:
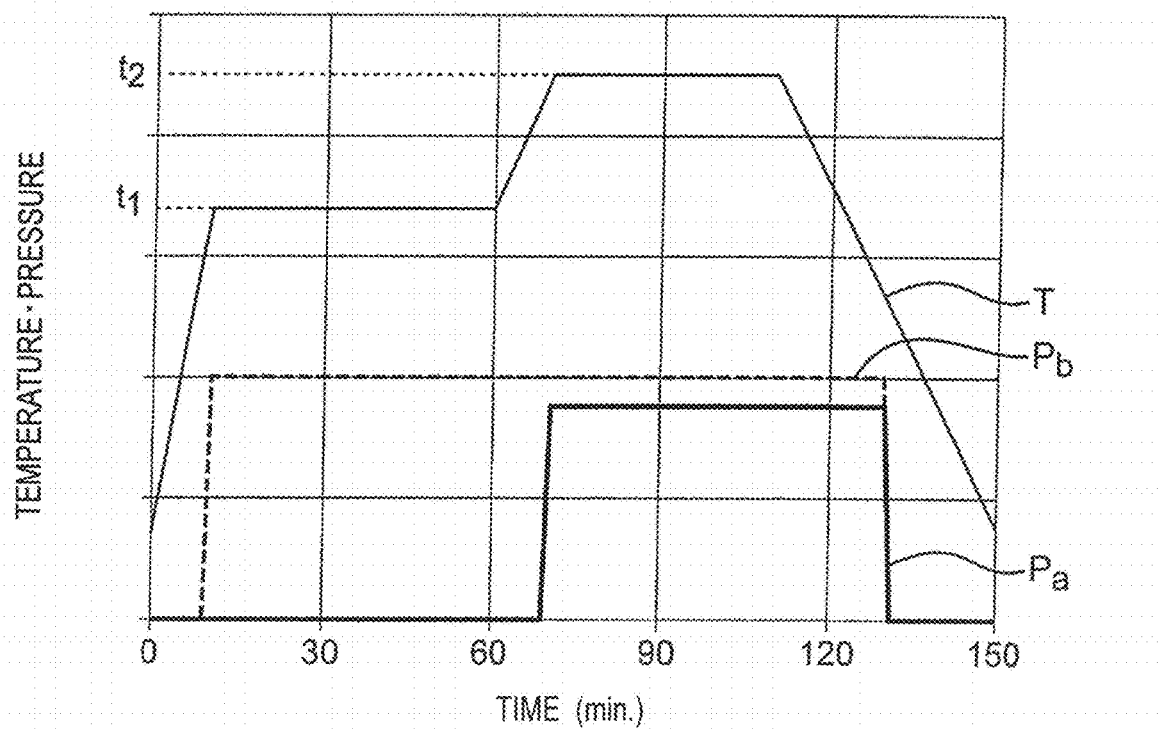
FIG. 14 shows a temperature profile and pressure profiles in step 3.

In this state, heating is performed to soften the front surface sheet 50, and pressure is applied with the front surface sheet 50 being in the softened state. FIG. 14 shows a temperature profile and pressure profiles in step 3. In FIG. 14, T represents the temperature profile, and Pa and Pb respectively represent a pressure profile used in the manufacturing method according to the first preferred embodiment and a pressure profile used in a conventional manufacturing method.

In step 3, the temperature is raised from a room temperature to a temperature $t_1$, for example, a temperature of about 120° C. or more and about 150° C. or less, which is lower than a minimum viscosity temperature, and then the temperature is maintained constant. This state is maintained without applying any pressure to allow the front surface sheet 50 to soften and deform into a shape that follows the projections and the depressions on the front surface of the resin sheet 30.

Subsequently, pressure is applied to the upper surface of the surface conductor 60 with a flat plate-shaped body in the Z-axis direction shown in FIG. 9, in a heated state at a temperature $t_2$, for example, a temperature of about 200° C. or more and about 250° C. or less, which is higher than the minimum viscosity temperature. In the application of the pressure, for example, a vacuum press performed under vacuum is used.

Figure 11:
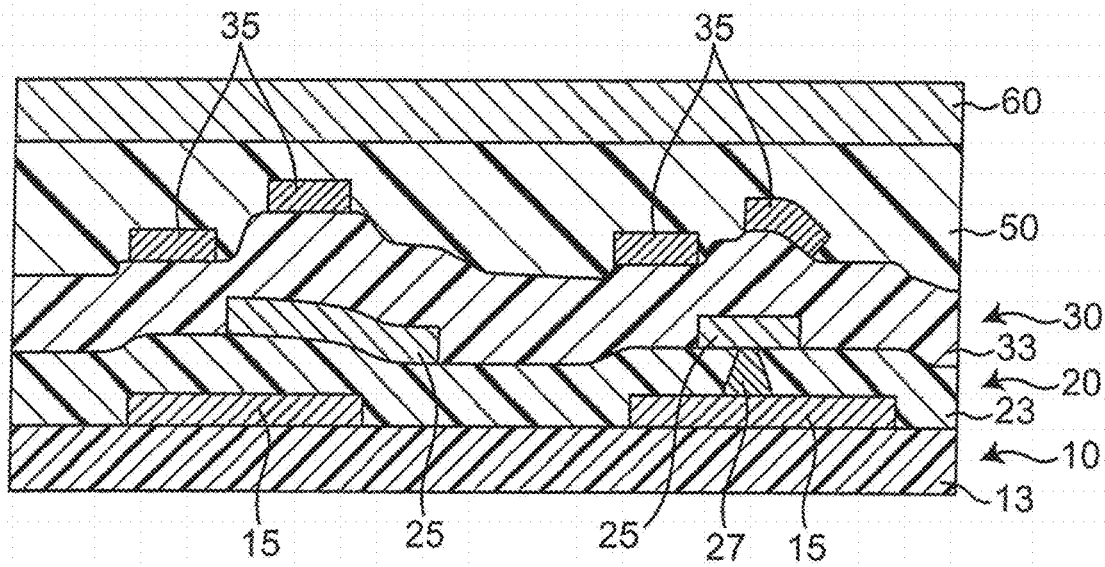
FIG. 11 is a cross-sectional view illustrating a manufacturing step of the multilayer wiring substrate according to the first preferred embodiment of the present invention.

As a result, as shown in FIG. 11, the front surface sheet 50 is joined onto the resin sheet 30, and the surface conductor 60 is joined onto the front surface sheet 50. The front surfaces of the front surface sheet 50 and the surface conductor 60 are preferably flat or substantially flat. In this step, since the resin sheet 30 includes the front surface with the projections and the depressions, the strength of the joint with the front surface sheet 50 is increased as compared to a case in which the front surface of the resin sheet 30 is flat or substantially flat. The front surface sheet 50 may alternatively be made of a plurality of layers. In that case, such a front surface sheet 50 is able to be achieved by repeating the process in step 3, for example.

Conventionally, pressure is applied according to the pressure profile Pb indicated by the broken line in FIG. 14. Thus, when height difference on the joint interface is large or height difference occurs in a narrow region, the projections and the depressions on the resin sheet 30 are not sufficiently filled with the front surface sheet 50 in some cases. In contrast, in step 3 of the first preferred embodiment, the pressure profile Pa is used, and therefore pressure is applied after the front surface sheet 50 is softened, enabling the projections and the depressions on the resin sheet 30 to be sufficiently filled with the front surface sheet 50.

The rate of temperature increase up to $t_1$ and the rate of temperature increase from $t_1$ to $t_2$ are, for example, from about 10° C./min to about 50° C./min, preferably from about 20° C./min to about 40° C./min, and, for example, about 30° C./min is employed. If the rate of temperature increase is too fast, the duration of the minimum viscosity is shortened, and thus the fluidity becomes insufficient to follow the projections and the depressions on the front surface of the resin sheet 30. On the other hand, if the rate of temperature increase is too slow, curing reaction of the thermosetting resin proceeds, causing the minimum viscosity to become higher. Consequently, the fluidity also becomes insufficient to follow the projections and the depressions on the front surface of the resin sheet 30. In order to obtain a sufficiently low minimum viscosity and to have enough flow time to follow the projections and the depressions, it is preferable to employ the rate of temperature increase described above.

Figure 15:
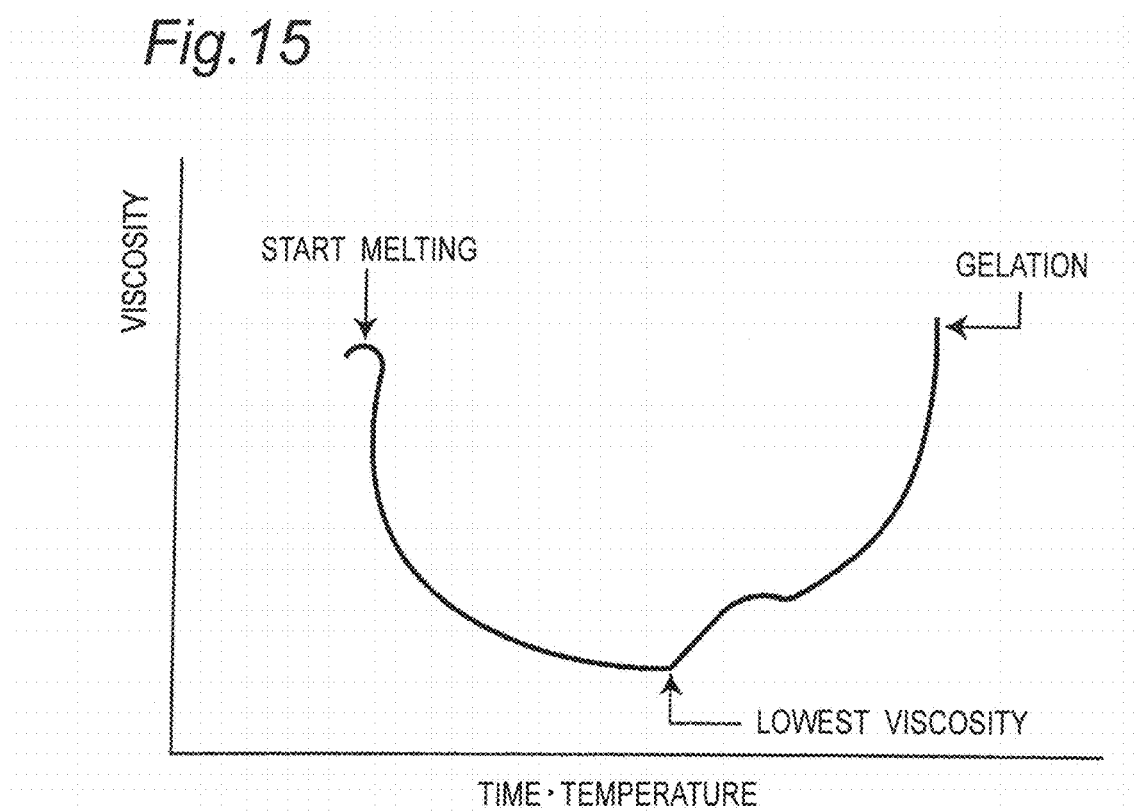
FIG. 15 shows changes in viscosity of a thermosetting resin contained in a front surface sheet during a curing reaction process.

Here, FIG. 15 shows changes in the viscosity of the thermosetting resin contained in the front surface sheet 50 during the curing reaction process. When the thermosetting resin is heated, the resin begins to melt at a predetermined melting temperature, and the viscosity decreases as the temperature rises. On the other hand, since the curing reaction proceeds due to the heating, the viscosity changes from downward to upward at a certain point (a minimum viscosity point). Therefore, the relationship of the viscosity to the temperature has a profile with a downward convex having a minimum viscosity as shown in FIG. 15. The temperature at which the viscosity reaches a lower limit is referred to herein as the "minimum viscosity temperature", and the temperature at which melting starts and the viscosity begins to decrease is referred to herein as the "melting temperature".

Figure 12:
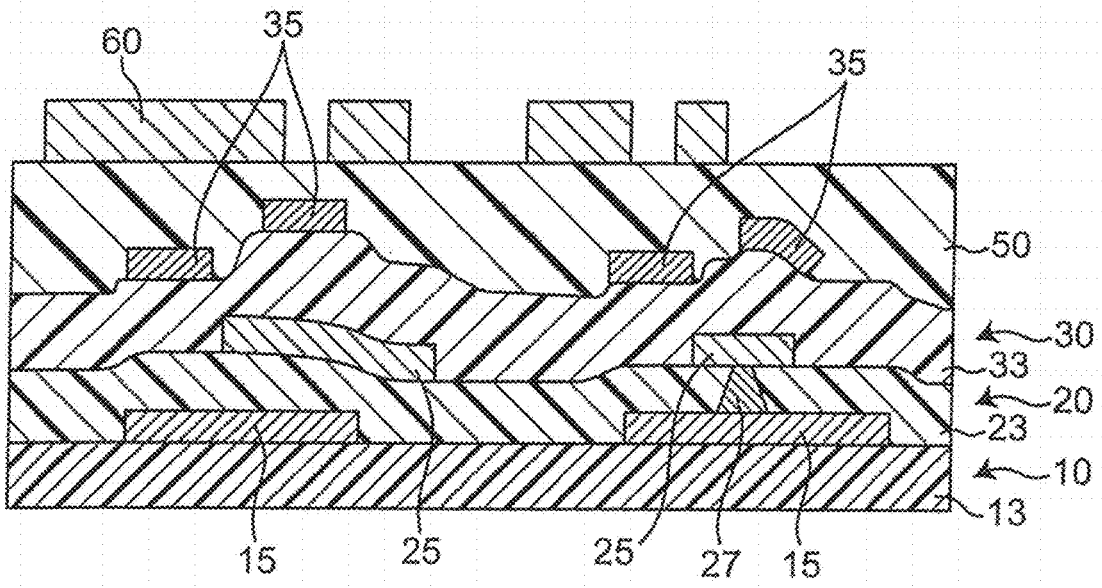
FIG. 12 is a cross-sectional view illustrating a manufacturing step of the multilayer wiring substrate according to the first preferred embodiment of the present invention.

Step 4: As shown in FIG. 12, the surface conductor 60 is patterned into a predetermined shape by lithography and etching techniques, for example. It is preferable that the film thickness (the thickness in the Z-axis direction) of the surface conductor 60 is larger than the film thicknesses of the other conductive patterns 15, 25, and 35. Increasing the film thickness of the surface conductor 60 makes the surface conductor 60 and the front surface sheet 50 less likely to deform, and therefore the front surface sheet 50 is less likely to peel off.

Figure 13:
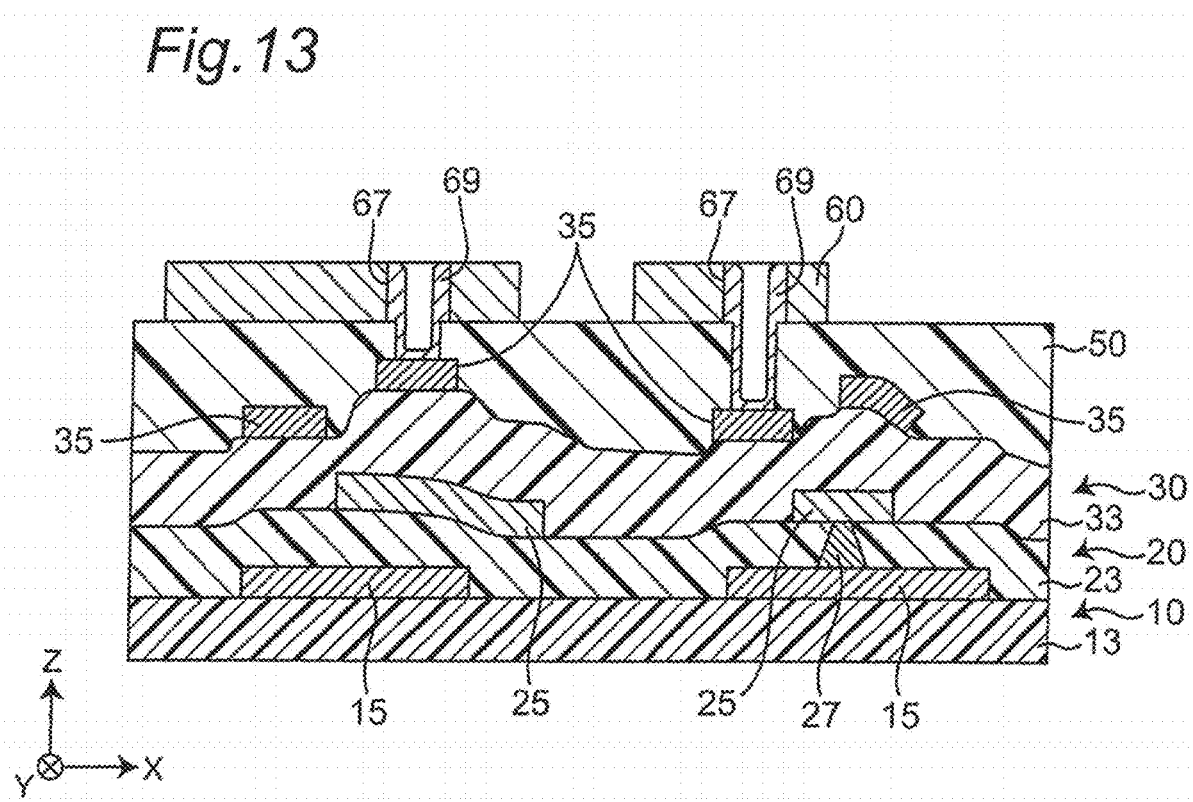
FIG. 13 is a cross-sectional view illustrating a manufacturing step of the multilayer wiring substrate according to the first preferred embodiment of the present invention.

Step 5: As shown in FIG. 13, openings 67 are preferably formed in the surface conductor 60 and the front surface sheet 50 by lithography and etching techniques, for example, and the openings 67 are filled by, for example, copper plating, thus forming the interlayer connection conductors 69. The interlayer connection conductors 69 are preferably made of the same material as the surface conductor 60.

Since the front surface sheet 50 is provided on the surface having projections and depressions, the interlayer connection conductors 69 provided in and on the front surface sheet 50 each have a respective different length. When the interlayer connection conductors 69 are formed by plating, the interlayer connection conductors 69 contain no resin and are able to have lower conductor resistance as compared to a case in which the interlayer connection conductors 69 contain resin, thus reducing a difference in resistance due to the lengths of the interlayer connection conductors 69.

Subsequently, the front surface sheet 50 and the surface conductor 60 are covered with the protective film 70, such as a solder resist, and patterning is performed to form the openings 77. The surface conductor 60 is exposed at bottoms of the openings 77.

The multilayer wiring substrate 100 according to the first preferred embodiment of the present invention shown in FIG. 1 is preferably completed by performing steps 1 to 5 described above. With this manufacturing method, a plate-shaped multilayer wiring substrate including flat surfaces on both sides is able to be obtained. In addition, since the joint interface between the resin sheets and the front surface sheet includes projections and depressions, the joint strength of the joint interface is improved.

Second Preferred Embodiment

Figure 16:
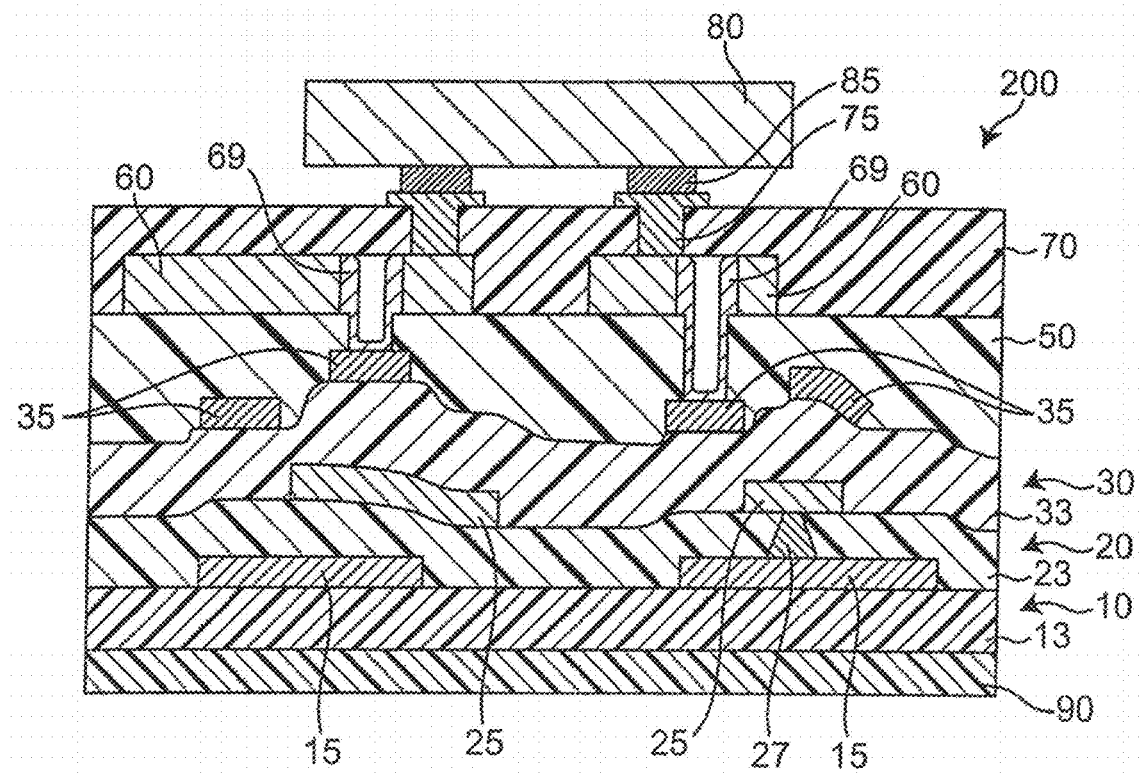
FIG. 16 is a cross-sectional view illustrating a case in which a surface mount component is mounted over a multilayer wiring substrate according to a second preferred embodiment of the present invention.

FIG. 16 is a cross-sectional view of a multilayer wiring substrate according to a second preferred embodiment of the present invention, which is denoted as a whole by the reference numeral 200, illustrating a state in which a surface mount component 80 is mounted. In FIG. 16, reference numerals that are the same as those in FIGS. 1 and 8 denote the same or corresponding portions.

In the multilayer wiring substrate 200 according to the second preferred embodiment of the present invention, a back surface sheet 90 defining a back surface layer is preferably further provided on a back surface of a resin sheet 10. The back surface sheet 90, as well as a front surface sheet 50, is preferably made of a thermosetting resin, for example, an epoxy resin, or an epoxy resin (glass epoxy) containing glass fiber or a spherical glass filler. Glass fiber, which has a higher elastic modulus than an elastic modulus of an epoxy resin, makes the front surface sheet 50 and the back surface sheet 90 less likely to deform, thus improving the connection reliability. The front surface sheet 50 and the back surface sheet 90 may be made of the same material.

The back surface sheet 90 may be joined to the back surface of the resin sheet 10 by sandwiching the front surface sheet 50 between the smooth base (not shown) made of a hard material and the resin sheet 10 and providing heating in step 3 (FIG. 11) of the first preferred embodiment.

In this manner, in the multilayer wiring substrate 200 according to the second preferred embodiment of the present invention, since the back surface sheet 90 having a higher elastic modulus than elastic moduli of the resin sheets 10, 20, and 30 is provided on the back surface of the resin sheet 10, the elastic modulus of the multilayer wiring substrate 200 is able to be increased to prevent bending, for example.

Third Preferred Embodiment

Figure 17:
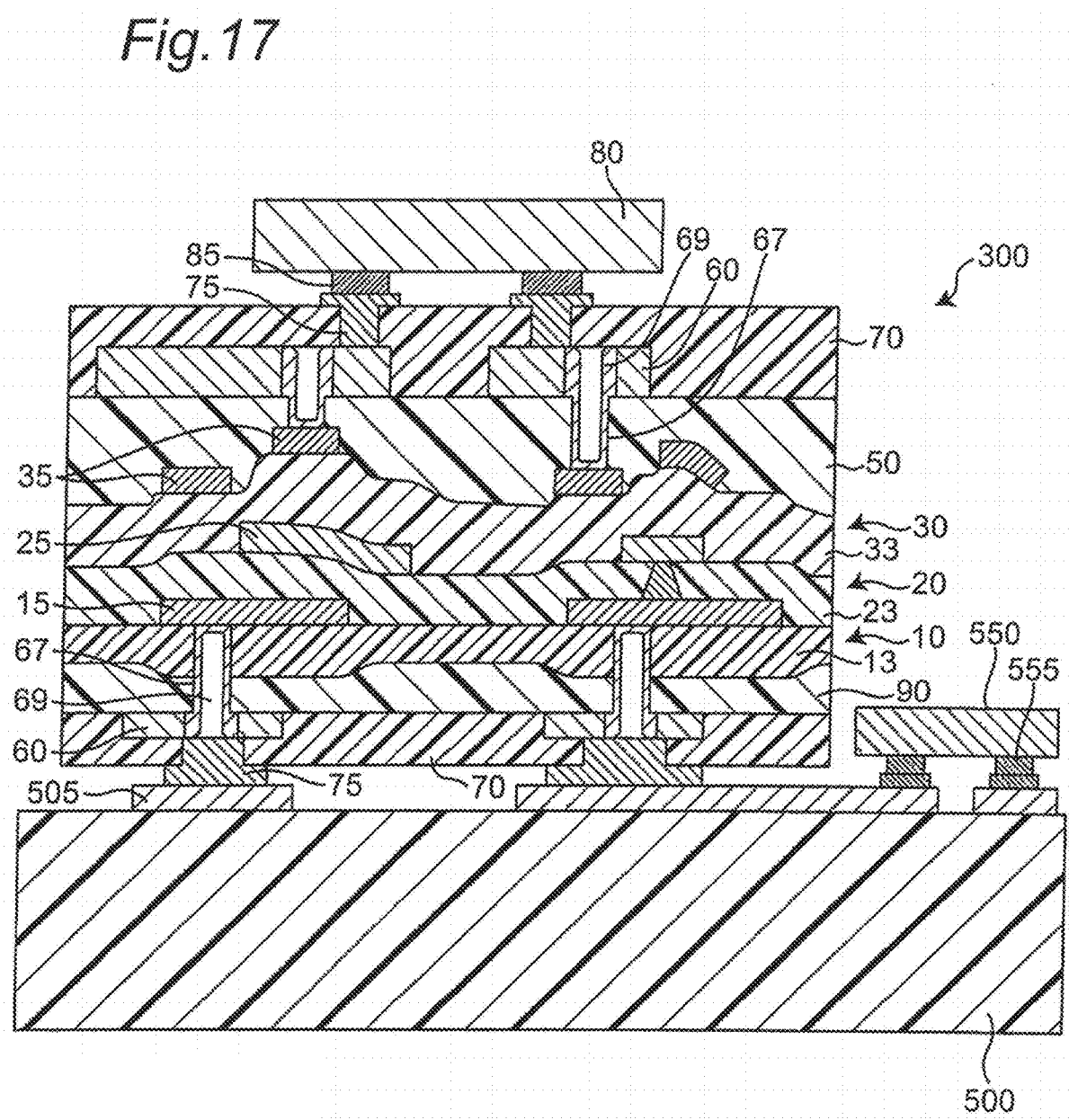
FIG. 17 is a cross-sectional view illustrating a case in which a surface mount component is mounted over a multilayer wiring substrate according to a third preferred embodiment of the present invention which is mounted over a mount substrate.

FIG. 17 is a cross-sectional view illustrating a state in which a surface mount component 80 is mounted over a front surface of a multilayer wiring substrate according to a third preferred embodiment of the present invention, which is denoted as a whole by the reference numeral 300, with the multilayer wiring substrate mounted over a mount substrate 500. In FIG. 17, reference numerals that are the same as those in FIGS. 1 and 8 denote the same or corresponding portions.

In the multilayer wiring substrate 300 according to the third preferred embodiment of the present invention, a back surface sheet 90 is preferably also joined to a back surface of a resin sheet 10 with a joint interface including projections and depressions, and a surface conductor 60 is provided on the back surface sheet 90, as is the case for a front surface side. The projections and the depressions on the front and back surfaces are obtainable by, for example, sandwiching the upper and lower sides of the stacked resin sheets between cushion layers and pressing the sandwiched resin sheets.

Openings 67 provided in the back surface sheet 90 and the surface conductor 60 are preferably filled by copper plating, for example, to define interlayer connection conductors 69, and a protective film 70 is provided at a back surface side of these members. Solder 75 is provided in openings provided in the protective film 70 and are connected to a conductive pattern 505 provided on the mount substrate 500. Over the conductive pattern 505, another mount component 550 is connected as necessary.

As described above, in the multilayer wiring substrate 300 according to the third preferred embodiment of the present invention, the surface mount substrate and other components are able to be connected at both the front and back sides of the multilayer wiring substrate 300, thus improving the packaging density. Further, since the hard back surface sheet 90 is also joined to the back surface via the joint interface having projections and depressions, the reliability of the connection with the mount substrate 500 is increased. The front surface sheet 50 and the back surface sheet 90 are preferably made of the same material.

Fourth Preferred Embodiment

Figure 18:
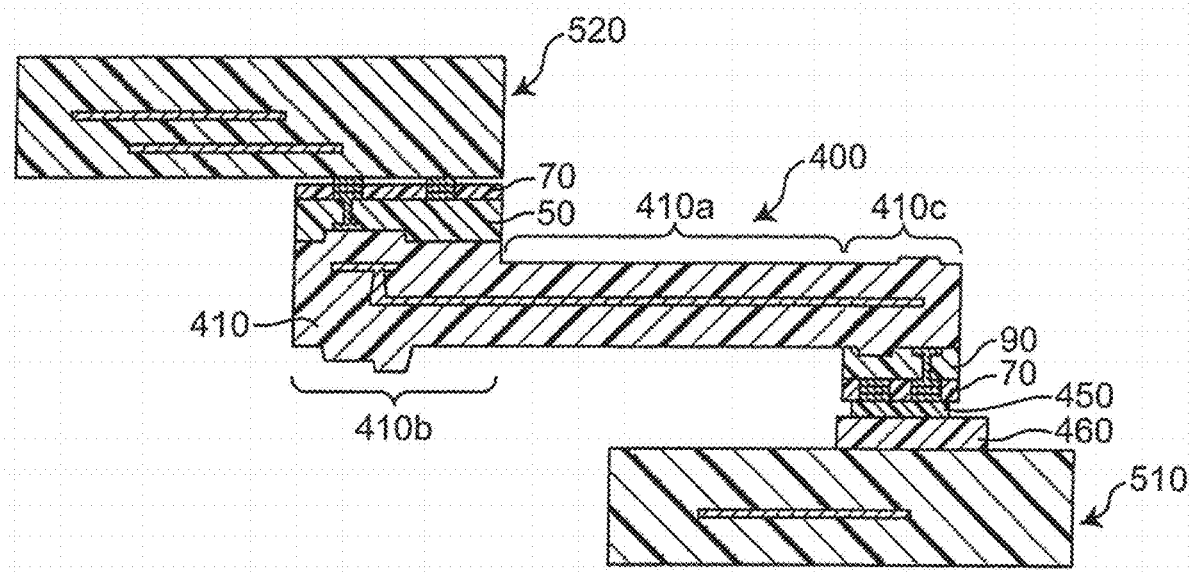
FIG. 18 is a cross-sectional view illustrating a case in which, in a multilayer wiring substrate according to a fourth preferred embodiment of the present invention, mount substrates are mounted to two rigid portions, between which a flexible portion is sandwiched.

FIG. 18 is a cross-sectional view illustrating a case in which, in a multilayer wiring substrate according to a fourth preferred embodiment of the present invention, which is denoted as a whole by the reference numeral 400, mount substrates 520 and 510 are respectively mounted to two rigid portions 410*b* and 410*c*, between which a flexible portion 410*a* is sandwiched.

The multilayer wiring substrate 400 preferably includes a resin sheet 410. As in the first preferred embodiment, the resin sheet 410 is preferably formed by stacking a plurality of resin sheets defined by insulating bases and conductive patterns. The individual resin sheets, however, are not shown in FIG. 18.

A front surface sheet 50 is joined to a front surface of one end of the resin sheet 410 with a joint interface including projections and depressions, and a protective film 70 is provided on the front surface sheet 50. Furthermore, a mount substrate 520 is mounted to the protective film 70. On the other hand, a back surface sheet 90 is also joined to a back surface of the other end of the resin sheet 410 with a joint interface including projections and depressions, and a protective film 70 is provided on the back surface sheet 90. Moreover, a mount substrate 510 is mounted to the protective film 70. The front surface sheet 50 and the back surface sheet 90 are preferably made of the same material.

Here, the resin sheet 410 and the mount substrate 520 are preferably joined with, for example, solder. On the other hand, the resin sheet 410 and the mount substrate 510 are connected by fitting a connector 450 fixed to the resin sheet 410 and a connector 460 fixed to the mount substrate 510.

The two end portions of the multilayer wiring substrate 400 at which the front surface sheet 50 and the back surface sheet 90 are respectively joined have a higher elastic modulus than an elastic modulus of a central portion where the front surface sheet 50 and the back surface sheet 90 are not joined. As shown in FIG. 18, the two end portions at which the front surface sheet 50 and the back surface sheet 90 are joined are referred to herein as "rigid portions 410b and 410c", respectively, and a portion sandwiched between the two rigid portions 410b and 410c is referred to herein as a "flexible portion 410a".

In the multilayer wiring substrate 400 including the rigid portions 410b and 410c and the flexible portion 410a as described above, the mount substrate 520 is first connected to the rigid portion 410b of the multilayer wiring substrate 400 with solder, and then the connector 450 fixed to the multilayer wiring substrate 400 is fitted into, and connected to, the connector 460 fixed to the mount substrate 510, in order to mount the mount substrates 510 and 520. In this connecting step, the flexible portion 410a of the multilayer wiring substrate 400 is easily deformed, facilitating the fitting work of the connectors 450 and 460.

FIG. 19 is a cross-sectional view illustrating a case in which the rigid portions 410b and 410c are connected to the mount substrates 520 and 510 with the flexible portion 410a of the multilayer wiring substrate 400 being bent. Even when the two mount substrates 510 and 520 are arranged in such positions as shown in FIG. 19, it is possible to connect the multilayer wiring substrate 400 and the mount substrates 510 and 520 by bending the flexible portion 410a of the multilayer wiring substrate 400.

In this manner, even when the flexible portion 410a of the multilayer wiring substrate 400 is bent, the front surface sheet 50 and the back surface sheet 90 having a high elastic modulus are joined, in the rigid portions 410b and 410c, to the surfaces of the resin sheet 410 with the joint interfaces including projections and depressions, and thus barely peel off from the resin sheet 410, so as to enable the highly reliable connection.

In the first to fourth preferred embodiments of the present invention, the resin sheets are preferably three layers, but the present invention is not limited to this, and two layers or any other number of layers may be provided. Further, the interlayer connection conductors, such as via conductors and plated-through hole conductors, are provided as necessary.

The foregoing first to fourth preferred embodiments of the present invention describe the cases in which the multilayer wiring substrates are manufactured by stacking the resin sheets and applying pressure to the resin sheets while heating the resin sheets. The present invention, however, is also applicable to a build-up multilayer wiring substrate in which a multilayer structure is manufactured by stacking insulating bases one by one and repeating drilling and wiring formation. In the build-up multilayer wiring substrate, since a front surface of the stacked resin sheets is flat or substantially flat, the front surface of the resin sheets may be pressed, while being heated, using a hard base material having a saw tooth cross section, for example, to thereby form projections and depressions on the front surface of the resin sheets and obtain a joint interface having the projections and the depressions.

Preferred embodiments of the present invention are usable as a wiring layer in an information terminal, such as a smartphone, and an electronic device, for example.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A multilayer wiring substrate comprising:
   at least two resin layers stacked on top of each other, each of the at least two resin layers including an insulating base and a conductive pattern provided on the insulating base;
   a front surface layer joined onto the at least two resin layers, the front surface layer having a higher elastic modulus than an elastic modulus of the insulating bases; and
   a protective film provided on the front surface layer; wherein
   the multilayer wiring substrate is plate-shaped;
   a joint interface between the at least two resin layers and the front surface layer includes projections and depressions;
   an upper surface of the front surface layer is flat or substantially flat;
   a surface conductor is provided on the front surface layer; and
   a roughness of an interface between the front surface layer and the protective film is smaller than a roughness of the joint interface between the at least two resin layers and the front surface layer.

2. The multilayer wiring substrate according to claim 1, wherein the front surface layer contains a glass filler.

3. The multilayer wiring substrate according to claim 2, wherein a particle diameter of the glass filler is smaller than height difference between the projections and the depressions on the joint interface.

4. The multilayer wiring substrate according to claim 3, wherein a portion of the glass filler is disposed in the depressions on the joint interface.

5. The multilayer wiring substrate according to claim 3, wherein the glass filler is entirely disposed in the depressions on the joint interface.

6. The multilayer wiring substrate according to claim 2, wherein a particle diameter of the glass filler is smaller than a film thickness of the conductive patterns.

7. The multilayer wiring substrate according to claim 2, wherein a particle diameter of the glass filler is equal to or less than about one-third of a smaller of a height difference between the projections and the depressions on the joint interface and a film thickness of the conductive patterns.

8. The multilayer wiring substrate according to claim 2, wherein the glass filler is also provided in a thinnest portion of the front surface layer.

9. The multilayer wiring substrate according to claim 2, wherein the glass filler has a bimodal particle diameter distribution.

10. The multilayer wiring substrate according to claim 1, wherein the front surface layer is made of a thermosetting resin.

11. The multilayer wiring substrate according to claim 10, wherein the thermosetting resin is an epoxy resin.

12. The multilayer wiring substrate according to claim 2, wherein the glass filler is glass fiber.

13. The multilayer wiring substrate according to claim 1, wherein the at least two resin layers are made of a thermoplastic resin.

14. The multilayer wiring substrate according to claim 1, wherein
the at least two resin layers further include an interlayer connection conductor passing through the insulating bases and containing a resin component; and
the front surface layer further includes an interlayer connection conductor passing through the front surface layer and containing no resin component.

15. The multilayer wiring substrate according to claim 1, wherein the surface conductor has a film thickness larger than a film thickness of the conductive patterns included in the at least two resin layers and is provided on a surface of the front surface layer opposite to the joint interface.

16. The multilayer wiring substrate according to claim 1, wherein a back surface layer having a higher elastic modulus than of an elastic modulus of the insulating bases is joined onto a surface of the at least two resin layers opposite to the joint interface.

17. The multilayer wiring substrate according to claim 16, wherein a joint interface between the back surface layer and the at least two resin layers includes projections and depressions.

18. The multilayer wiring substrate according to claim 16, wherein the front surface layer is made of a material identical to a material of the back surface layer.

19. The multilayer wiring substrate according to claim 16, wherein the at least two resin layers include a first portion joined to the front surface layer or to the back surface layer, and a second portion that is not joined to either of the front surface layer or the back surface layer.

20. The multilayer wiring substrate according to claim 19, wherein the second portion is bent.

21. The multilayer wiring substrate according to claim 1, further comprising a mount component electrically connected to the conductive patterns.

* * * * *